United States Patent [19]

Zur

[11] Patent Number: 4,954,779
[45] Date of Patent: Sep. 4, 1990

[54] CORRECTION FOR EDDY CURRENT CAUSED PHASE DEGRADATION

[75] Inventor: Yuval Zur, Herzliya, Israel

[73] Assignee: Elscint Ltd., Haifa, Israel

[21] Appl. No.: 344,806

[22] Filed: Apr. 28, 1989

[30] Foreign Application Priority Data

Apr. 29, 1988 [IL] Israel .......................................... 86231

[51] Int. Cl.⁵ ............................................ G01R 33/20
[52] U.S. Cl. ............................. 324/306; 128/653 AF
[58] Field of Search ............... 324/306, 307, 309, 312; 128/653

[56] References Cited

U.S. PATENT DOCUMENTS

| | | | |
|---|---|---|---|
| 4,683,431 | 7/1987 | Pattany et al. | 324/306 |
| 4,870,361 | 9/1989 | In Den Kleef et al. | 324/309 |

OTHER PUBLICATIONS

C. L. Dumoulin et al. "Multiecho Magnetic Resonance Angiography", Mag. Res. in Med. vol. 5, pp. 47–57 (1987).

MR Research Note; Selected Abstracts submitted to the 6th SMRM, 1987, by Philips Medical Systems; p. 16.

E. L. Hahn, Journal of Geophysical Research vol. 65, No. 2, pp. 776–777.

Primary Examiner—Michael J. Tokar
Assistant Examiner—Kevin D. O'Shea
Attorney, Agent, or Firm—Sandler, Greenblum & Bernstein

[57] ABSTRACT

A system corrects for phase angles degradation due, for example to eddy currents, and uses the corrected phase angles to determine flow. The system acquires flow compensated low resolution images and uncompensated low and normal resolution images of a flowing fluid. The images include phase angle data. The phase angle data of the low resolution images are subtracted from the corresponding phase angle data of the normal resolution images to obtain phase angle corrected compensated and uncompensated images. The phase angle corrected compensated images are subtracted from the phase angle corrected uncompensated images to obtain flow images with minimized phase angle distortion. Reliable and accurate flow velocity for each pixel is thereby obtained using the minimized phase angle distortion flow images.

12 Claims, 3 Drawing Sheets

CORRECTION FOR EDDY CURRENT CAUSED PHASE DEGRADATION

FIELD OF THE INVENTION

This invention is concerned with magnetic resonance imaging (MRI) and more particularly with the reduction of eddy current caused artifacts in such images.

BACKGROUND OF THE INVENTION

The gradients used in magnetic resonance imaging (MRI) systems generate eddy currents. The eddy currents change the phase of each pixel in an unknown manner. Therefore, when phase differences are measured, such as in certain flow sequences, there is no way of knowing how much of the phase differences are due to flow and how much are due to eddy currents.

Some scan sequences use gradients of a first polarity followed by gradients of an opposite polarity as part of the sequence to quantify flow for example. The gradients each produce eddy currents that are not necessarily matched and hence not cancelled by subtraction methods. Accordingly, in such scan sequences the phase differences due to eddy currents cause erroneous flow measurements.

Accordingly, those skilled in the art have been and are still attempting to develop systems and/or methods to correct for eddy current caused phase angle degradation.

BRIEF DESCRIPTION OF THE INVENTION

Accordingly, it is an object of the present invention to provide means and apparatus for correcting for eddy current caused phase angle degradation.

In accordance with a broad aspect of the present invention, a method of minimizing eddy current generated phase angle changes in magnetic resonance imaging (MRI) data is provided, said method comprising the steps of:

acquiring low resolution data generated by spins that have been perturbed into a transverse plane, said acquisition of data occurring in the time domain using a multi-dimensional scan sequence, Fourier transforming the acquired time domain low resolution data to obtain amplitude and phase values for pixels of an image, said values including phase value changes due to eddy currents and movement of the spins, operating on the acquired time domain data to pass substanitally only data with phase changes due to eddy currents, Fourier transforming the operated on data to obtain phase and amplitude values for each pixel wherein the phase values are those caused by eddy currents, and subtracting the phase angle of each pixel obtained by Fourier transforming the operated on data from the phase angle of each pixel obtained by Fourier transforming the unoperated on time domain data to thereby provide an image restricted to phase changes caused by movement of the spins without eddy current caused phase changes.

In accordance with the present invention a further feature comprises a method of correcting for eddy current caused phase distortions and using the corrected measured phase angles to determine flow, said method comprising the steps of:

acquiring an uncompensated low resolution image of a flowing fluid, acquiring a flow compensated low resolution image of said flowing fluid, obtaining a normal resolution uncompensated image of said flowing fluid, obtaining a normal resolution flow compensated image of said flowing fluid, said images including phase angle data, subtracting the phase angle data of the low resolution images from the corresponding phase angle data of the normal resolution images to provide phase angle corrected compensated and uncompensated images, subtracting said phase angle corrected compensated images from said phase angle corrected uncompensated images to obtain a flow image with minimized phase angle distortion, and using the phase angle of said flow image with minimized phase angle distortion to obtain the flow velocity for each pixel of said flow image.

BRIEF DESCRIPTION OF THE DRAWINGS

The above named and other features and objects of the present invention will be best understood when considered in the light of the following description of a broad aspect of the invention made in conjunction with the attached drawings, wherein.

GENERAL DESCRIPTION

Figure 1:
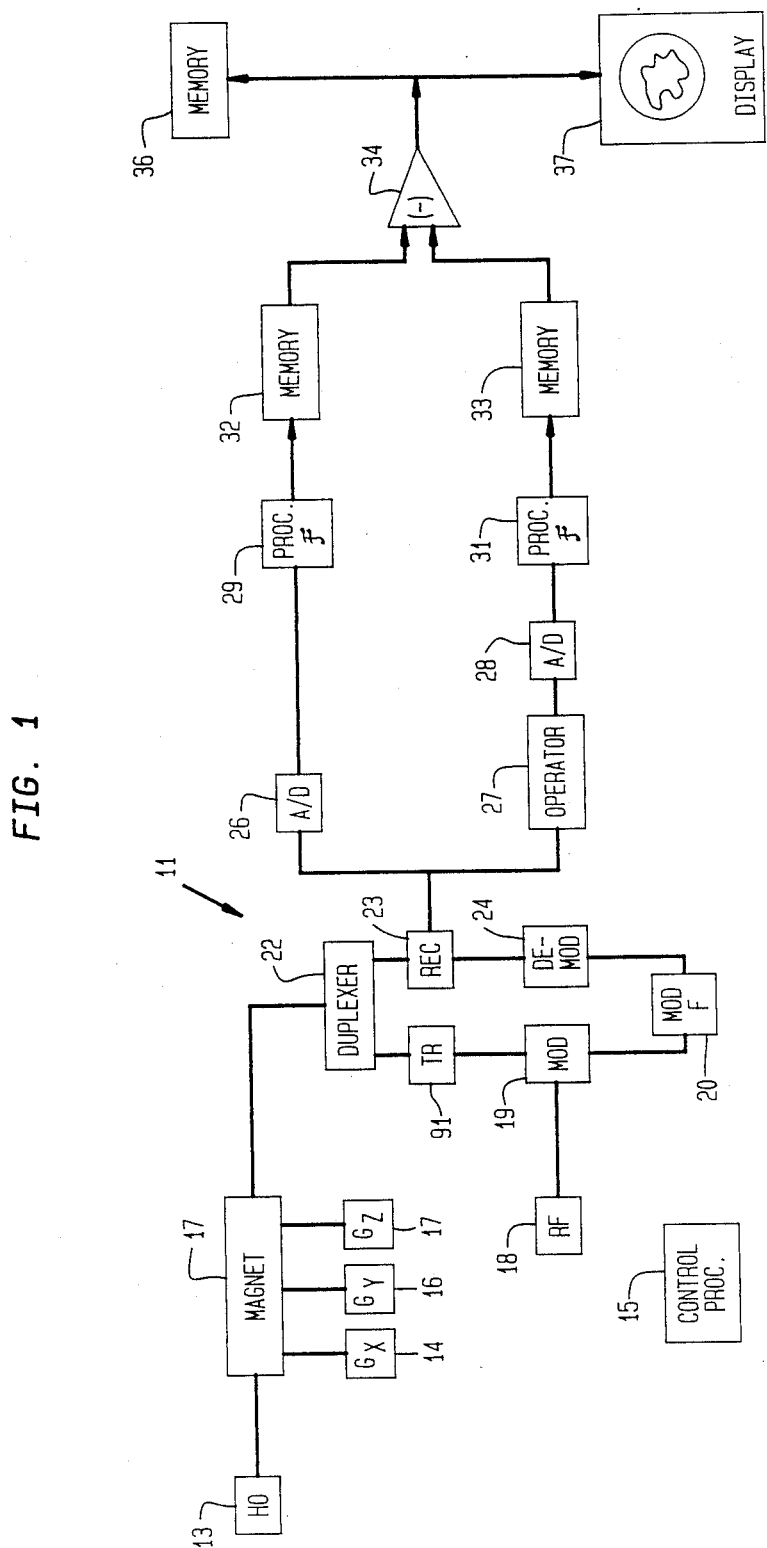
FIG. 1 is a block diagram of the invention system.

The magnetic resonance imaging system 11 shown in FIG. 1 includes a large body magnet 12 for receiving a patient for MR studies. The large static magnetic field is generated by magnetic field generator 13, shown as HO. The large static magnetic field, as is well-known, aligns nuclei having an odd number of protons and/or neutrons; that is, nuclear particles that have both spin angular momentum and a magnetic dipole moment. These atomic particles, having both characteristics are referred to herein as "spins". A radio frequency (RF) magnetic field is applied as pulses transverse to the large static magnetic field. The RF pulses apply energy to the spins; effectively perturbing or "tipping" them into a transverse plane, for example. After the excitation by the RF magnetic field pulse, the spins gradually disperse (dephase) and also return to alignment with the static field. In so doing, the spins surrender energy in the form of weak but detectable free induction decay (FID) signals.

These FID signals are detected and used by a system controlled by a computer-controller to produce images in a well known manner. The excitation frequency of the RF pulses and the FID frequency are defined by what is known as the Larmor relationship which states that the angular frequency ω of the precession of the spins is the product of the magnetic field B acting on the spins and the gyromagnetic ratio γ, a fundamental nuclear physical constant for each nuclear species. Mathematically then:

$$f = \gamma B / 2\pi.$$

Therefore, by superimposing a linear gradient field on the static uniform field, spins in a selected plane can be excited by proper choice of the RF excitation frequency. Magnetic resonance techniques have gone from spectroscopy measurements to imaging and more recently to imaging of the type which can both illustrate and quantify blood flow.

The measurement of flow using MR techniques was disclosed by Dr. Hahn in the Journal of Geophysical Research, Vol. 65, No. 2 pp. 776, (1960). As is well known, when using a spin echo sequence, first the spins are tipped 90 degrees by a 90 degree RF pulse into the transverse plane and then after some dephasing are reverted (rephased) by a 180 degree RF pulse. An echo occurs at a time tau ($\tau$) after the application of the 180 degree pulse. The time $\tau$ is equal to the time between the 90 degree pulse and the 180 degree pulse. Thus, an echo is normally produced at a time $2\tau$ after the application of the 90 degree pulse, if the spins have no motion, i.e., ds/dt and/or higher orders equal zero. If the spins are in motion, that is, if they have their own velocity, for example, an echo still will occur at the time $2\tau$ except that the azmithal angle to which the spins reconverge in the rotating frame will be shifted by amount $\Delta\phi = (G, V)\tau^2$; where:

G is the linear magnetic gradient vector, and
V is the flow velocity.

Thus, the difference $\Delta\phi$ between the azmithal angle in a motion sensitive image and in a motion insensitive image, for example, ideally enables a computation to obtain the velocity of the imaged object such as a body fluid at each pixel in the image. The indeterminate amount of phase degradation due to eddy currents however seriously reduces the accuracy of the computation.

The adverse effect of the eddy current on the phase is increased in motion measurement experiments using motion encoding gradients because to obtain motion sensitive image it has been found necessary to use large gradients. See for example, U.S. Pat. No. 4,516,075 which teaches the use of relatively large tailored gradients. The magnetic gradient fields taught in that patent, produce large eddy currents and consequently large undetermined phase distortion. Thus measurement of the velocity determined as a function of phase normally includes errors due to the eddy currents.

Many attempts have been made to overcome this problem. One such attempt is described in an article published in MR Research Note Selected Abstracts submitted to the 6th SMPM, (a Phillips Medical Systems Publication) on page 16 (1987). The article describes a method using complex mutiplcation along with iterative techniques providing a spatially non-linear phase correction to correct for eddy current caused phase degradation. The method is unduly complex.

Another technique for overcoming the phase errors obtained by the gradients used in obtaining a motion sensitized image uses shielded gradient coils to minimize eddy current effects, see for example, an article entitled "Multi-echo Magnetic Resonance Angiography" by C. L. Dumoulin et al, published in Magnetic Resonance in Medicine Vol 5, pp. 47-457 (1987).

The unique technique described herein does not require shielded gradient coils nor complex manipulation such as the iterative techniques and obtaining the cartesian products of Chebyshev polynomials. Instead a relatively straightforward low resolution image data acquisition system in conjunction with windowing are used as will be explained in the description of FIG. 1.

The location of the FID signals (or echoes) is determined using gradient magnetic fields. To obtain the gradient magnetic fields a magnetic field gradient generator 14 providing a gradient field in the X direction, a magnetic field generator 16 providing a gradient field in the Y direction and a magnetic field gradient generator 17 which creates a magnetic field gradient in the Z direction are shown.

In the transmitting mode an RF pulse is first transmitted through a coil, not shown, in the main magnet 12. The RF pulse is derived from the RF generator 18 which sends the RF frequency pulse to a modulator 19 for shaping. The modulated shaped signal is transmitted by transmitter 21 through duplexer 22.

In the receive mode, the received signal (FID or Echo) is picked up by a coil not shown in the main magnet 12 and passes through the duplexer 22 to a receiver 23. The pick-up coil may be the same coil used to transmit the RF pulses. The received signal is sent to a demodulator 24. Both the modulator and the demodulator are supplied with the modulation frequency by the modulation frequency generator 20. The demodulated signal in accordance with the invention of this application is sent both to an A to D converter 26 and to a system operator 27 for passing only part of the time domain data. A result of operator 27 is a low resolution image.

The operator 27 in one embodiment is a "window". In FIG. 2a the window is depicted as a step function. For the purposes of this invention any window which passes only the central section of the received time domain signal can be used. Such a window passes only the lower spatial frequency signals. The phase degradation signals caused by eddy currents are relatively low spatial frequency signals and therefore, they are passed by window 27. The phase angle change caused by motion of spins are relatively high spatial frequency signals which are not passed by window 27.

Both the signals which have passed through the window 27 and the signals which have not been subjected to operation by the window 27 are processed by a two dimensional Fourier transform as indicated by the Fourier Transform Processor blocks 29 and 31 respectively. The outputs of the Fourier transform processors are amplitude and phase data which are placed into memories 32, 33, area by area, with each area corresponding to a pixel of the image.

The memory 33, which contains low resolution data from the window, contains substantially only the eddy current phase degradation information. The memory 32 contains data from signals that were not subject to the window operation and thus includes the value of the phase as affected by both spin motion and eddy current degradation. Therefore, to minimize the eddy current caused phase degradation, memory 33 is subtracted from memory 32 in subtraction amplifier 34. The output of subtraction amplifier 34 is the phase corrected image which is placed in memory 36 for display in display unit 37. The display in display unit 37 therefore is practically free of artifacts due to eddy current caused phase angle changes.

The same process is provided both for compensated and uncompensated received signals. Compensated signals are used herein means that the phase is independent of the spin velocity so that all the spins—moving and stationary have the same phase. Uncompensated data means that the phase is dependent on the velocity of the spins.

FIG. 2a graphically represents the "window" or "multiplcation" operation of operator 27. The received signal shown at 41 is first operated on by a window to obtain a low resolution image by passing only low spatial frequency signals. The received signal is multipled by or pass through a window such as step function 42 that will result in a signal 43 that includes only spatial frequencies. As previously mentioned other window shapes i.e. gaussian, tradezoidal, etc., could also be used within the scope of the invention. The criteria is the passage of only low spatial frequencies. The singnal 43 depicts the phase changes caused by the eddy currents. Thus, it contains the phase error which causes the artifacts in flow experiments and which those skilled in the art have been attempting to remove for a relatively long period of time. The signal 43 is in the time domain so it is operated on by the Fourier transform indicated at 44 to provide phase data for areas of the matrix 46 that correspond to image pixels.

The received signal 41 that is not passed through a window as shown in FIG. 1 is operated on directly by Fourier transform operator as shown at 47 to provide phase data for a memory 48. The phase data values contain phase variations due to spin motion as well as the eddy current caused phase distortion. The data of memory 46 which contains only the eddy current caused phase changes is subtracted from the data of memory 48 to provide an image free of the phase changes caused by the eddy current. This is indicated in memory 49 which is a memory of the phase data without eddy current caused degradation.

Figure 2:
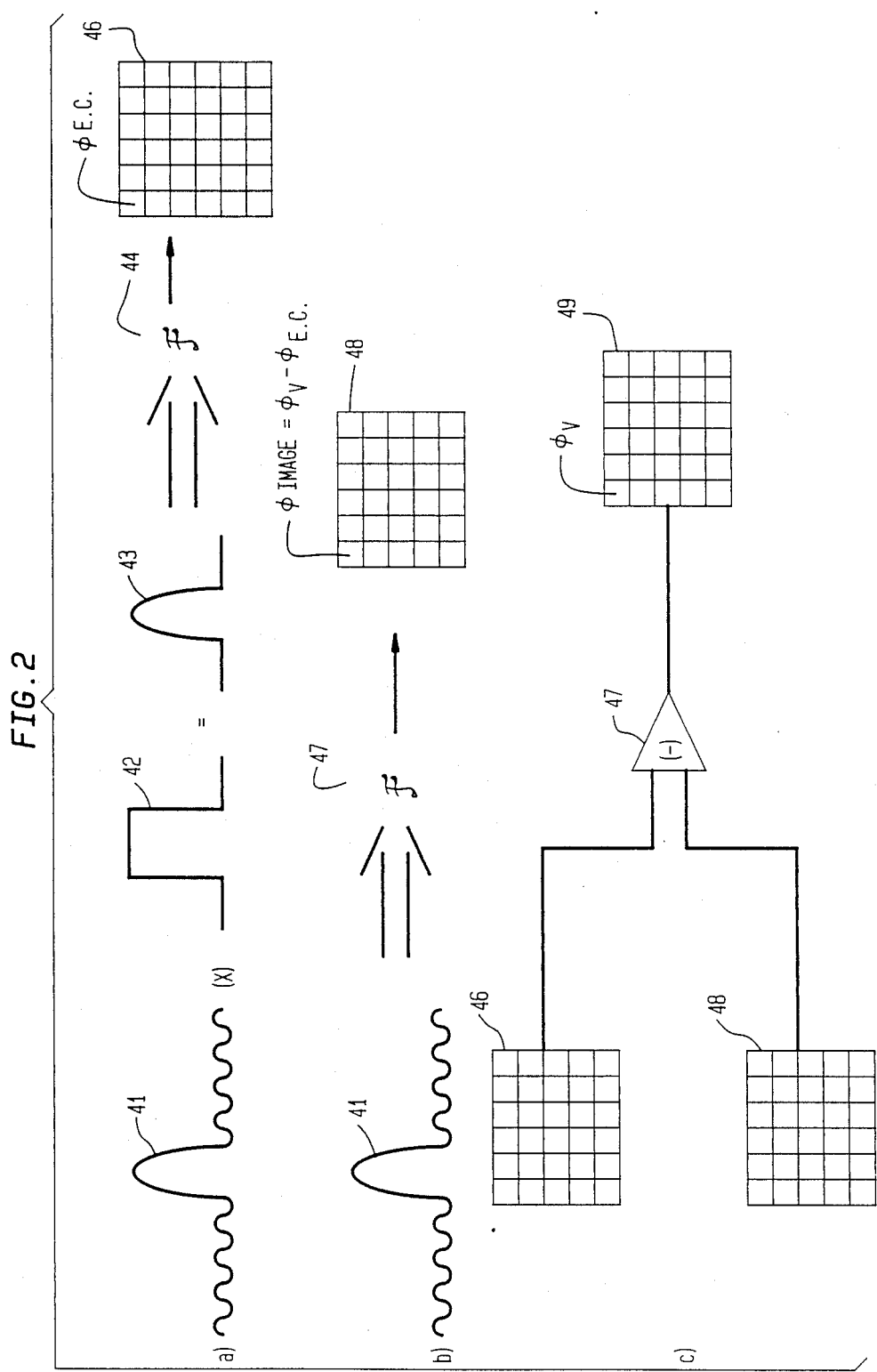
FIG. 2a is a line drawing showing a "window" or "multiplication" operation of the system of FIG. 1 used to separate the eddy current caused phase angle images.
FIG. 2b shows the processing of the received signals for an image of normal resolution to obtain the total phase angle image.
FIG. 2c shows the subtraction of the phase angle image of FIG. 2a from the phase angle image of FIG. 2b for obtaining a phase angle image that is proportional to the velocity without the eddy current caused phase angle distortion.

The system of minimizing eddy current caused phase angle changes presently finds a useful application in the measurement of flow of blood or other body fluids, for example. Thus if compensated and uncompensated image data is acquired and operated on by the system of FIG. 1 as shown in FIG. 2 then the final flow data will not suffer inaccuracies due to eddy current caused phase angle changes.

Figure 3:
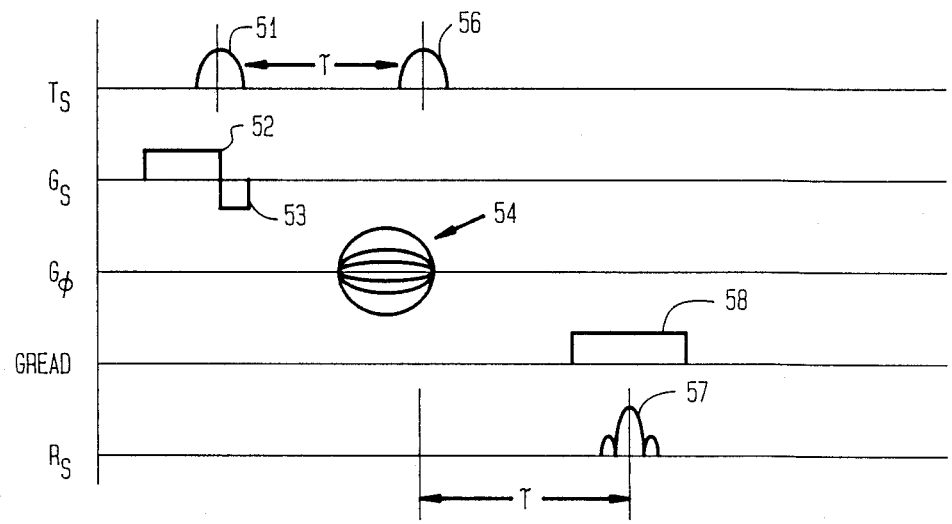
FIG. 3 shows a scan sequence for acquiring uncompensated data.
Figure 4:
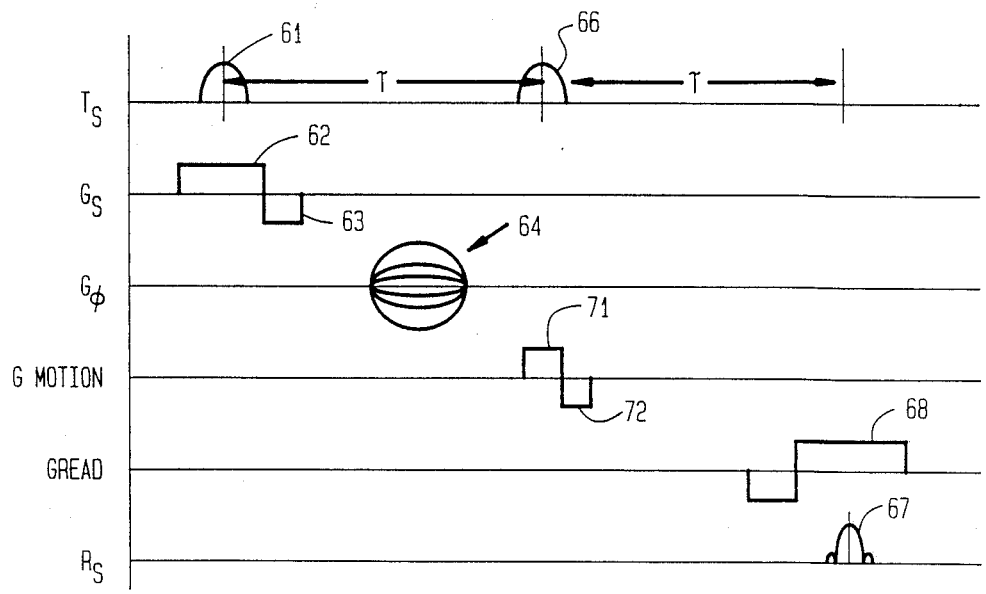
FIG. 4 shows a scan sequence for acquiring compensated data.

The sequence of FIG. 3 is a sequence for acquiring uncompensated data and the sequence of FIG. 4 is for acquiring compensated flow data. Other sequences could be used in place of the particular sequences shown. For example, sequences discussed in a patent application filed in the United States on Jan. 24, 1989, which received Ser. No. 300,980 and is assigned to the assignee of this invention could also be used in place of the sequences shown in FIGS. 3 and 4.

FIGS. 3 and 4 are based on the classical spin echo sequence. In FIG. 3, a 90 degree pulse 51 is applied during the application of a slice select gradient 52. The slice select gradient has the usual negative going portion 53. The pulse 51 tips the spins into the transvese plane. The spins that are tipped are selected by the slice select gradient pulse. Subsequently, one of the phase encoding pulses of phase encoding pulses 54 are applied.

Then a 180 degree RF pulse 56 is applied to rephase the dephasing spins in the transverse plane. At a time $\tau$ after the application of the 180 degree RF pulse which is equal to the time $\tau$ between the 90 degree RF pulse and the 180 degree RF pulse, an echo occurs. The echo signal is shown at 57. It occurs during the application of a read gradient pulse 58.

A compensated sequence is shown in FIG. 4. The main difference between the sequence of FIGS. 3 and 4 are the bipolar gradient pulses 71, 72. The bipolar gradient pulse 71, 72 are used to encode moving spins by creating a phase difference in moving spins only. Because they are bipolar they have practically no effect on stationary spins.

The phase of the moving spins is used to obtain velocity from the following equation (see the above noted patent application):

$$\Delta\phi = \gamma \left[ \int_{t_0}^{t} Z_o G z(t) dt - \int_{t_0}^{t} V G z(t) dt \right].$$

Where:
Zo is spin position at t=0 (t), and
V is the spin velocity (assumed constant)

However, as noted hereinbefore that phase angle $\Delta\phi$ is normally not accurately determined due to eddy current caused phase degradation. Utilizing the system of FIG. 1 as illustrated in FIG. 2 the phase degradation due to eddy currents can be removed so that the phase represents a true linear function of the velocity.

Accordingly, in operation the system shown in FIG. 1 can provide a true flow velocity image from the subtraction of the two images.

The two images are: (1) the image of the flow including phase variations in the pixels caused by the eddy current; and (2) an image wherein substantially all phase angle variations caused by the eddy current have been removed. Then by subtracting the phase of the second image from that of the first image, the resulting image is a phase angle image due to the velocity of the spins without the degradation caused by the eddy currents.

While the invention has been described with reference to specific embodiments it should be understood that these embodiments are exemplary only and are not to be construed as limitations on the scope of the invention.

What is claimed is:

1. A method of correcting for eddy current caused phase distortions in the magnetic resonance images, said method comprising the steps of:
   acquiring normal resolution time domain magnetic resonance imaging (MRI) data,
   acquiring low resolution time domain magnetic resonance imaging (MRI) data,
   Fourier transforming the normal resolution time domain MRI data,
   Fourier transforming low resolution MRI data,
   obtaining the phase images in the frequency domain after the steps of Fourier transforming, and
   subtracting the phase image of the low resolution data from the phase image of the normal resolution data to provide a phase image corrected for eddy current caused phase distortion.

2. The method of correcting for eddy current caused phase distortions of claim 1 wherein the steps of acquiring normal resolution time domain MRI data comprises using a normal data acquisition sequence to obtain original time domain MRI data, and wherein the step of acquiring the low resolution MRI data comprises the step of operating on said normal resolution MRI data to obtain data of only low spatial frequency.

3. The method of claim 2 wherein said step of operating on said normal resolution MRI data comprises spatial frequency filtering of said original time domain MRI data.

4. The method of claim 2 wherein said step of operating on said normal resolution MRI data comprises windowing said original MRI data with a function that will obtain data of only low spatial frequency.

5. A method of correcting for eddy current caused phase distortion and using the corrected measured phase angles to determine flow, said method comprising the steps of:
acquiring an uncompensated low resolution image of a flowing fluid,
acquiring a flow compensated low resolution image of said flowing fluid,
obtaining a normal resolution uncompensated image of said flowing fluid,
obtaining a normal resolution flow compensated image of said flowing fluid,
said images, including phase angle data,
subtracting the phase angle data of the low resolution image from the corresponding phase angle data of the normal resolution image to provide phase angle corrected compensated and uncompensated images,
subtracting the said phase angle corrected compensated and uncompensated
images to obtain a flow image with minimized phase angle distortion, and
using the phase angle of said flow image with minimized phase angle distortion to obtain the flow velocity for each pixel of said flow image.

6. The method of claim 5 wherein the velocity is determined by obtained solution for V in the following equation:

$$\Delta\phi = \gamma \left[ \int_{t_o}^{t} Z_o Gz(t)dt - \int_{t_o}^{t} V Gz(t)dt \right]$$

where:
$Z_o$ is spin position at time $t=0(t_o)$, and
V is the spin velocity.

7. A system for correcting for eddy current caused phase distortions in magnetic resonance images, said system comprising:
means for acquiring normal resolution time domain magnetic resonance imaging (MRI) data,
means for acquiring low resolution time domain magnetic resonance imaging (MRI) data,
means for Fourier transforming the normal resolution time domain MRI data,
means for Fourier transforming the low resolution MRI data,
means for obtaining the phase images in the frequency domain after the steps of Fourier transforming, and
means for subtracting the phase image of the low resolution data from the phase image of the normal resolution data to provide a phase image corrected for eddy current caused phase distortion.

8. The system of correcting for eddy current caused phase distortions of claim 7 wherein the means for acquiring normal resolution time domain MRI data comprises means for using a normal data acquisition sequence to obtain original time domain MRI data, and wherein the means for acquiring the low resolution MRI data comprises means for operating on said original MRI data to obtain data of only low spatial frequency.

9. The system of claim 8 wherein said means for operating on said original MRI data comprises filter means for spatial frequency filtering of said original time domain MRI data.

10. The system of claim 8 wherein said means for operating on said original MRI data comprises windowing means for windowing said original MRI data with a function that will obtain data of only low spatial frequency.

11. A system for correcting for eddy current caused phase distortion and for using the corrected measured phase angles to determine flow, said system comprising:
means for acquiring an uncompensated low resolution image of a flowing fluid,
means for acquiring a flow compensated low resolution image of said flowing fluid,
means for obtaining a normal resolution uncompensated image of said flowing fluid,
means for obtaining a normal resolution flow compensated image of said flowing fluid,
said images, including phase angle data,
means for subtracting the phase angle data of the low resolution image from the corresponding phase angle data of the normal resolution image to provide phase angle corrected compensated and uncompensated images,
means for subtracting the said phase angle corrected compensated and uncompensated images to obtain a flow image with minimized phase angle distortion, and
means using the phase angle of said flow image with minimized phase angle distortion to obtain the flow velocity for each pixel of said flow image.

12. The system of claim 11 wherein the velocity is determined by means for obtaining a solution for V in the following equation:

$$\Delta\phi = \gamma \left[ \int_{t_o}^{t} Z_o Gz(t)dt - \int_{t_o}^{t} V Gz(t)dt \right]$$

where:
$Z_o$ is spin position at time $t=0(t_o)$, and
V is the spin velocity.

* * * * *